United States Patent [19]

McLachlan et al.

[11] Patent Number: 5,585,661
[45] Date of Patent: Dec. 17, 1996

[54] SUB-MICRON BONDED SOI BY TRENCH PLANARIZATION

[75] Inventors: Craig J. McLachlan, Melbourne Beach; Anthony L. Rivoli, Palm Bay, both of Fla.

[73] Assignee: Harris Corporation, Melbourne, Fla.

[21] Appl. No.: 108,358

[22] Filed: Aug. 18, 1993

[51] Int. Cl.[6] .................................................. H01L 29/00
[52] U.S. Cl. ........................... 257/506; 437/61; 437/62; 437/63; 437/225; 437/235; 437/974
[58] Field of Search ..................... 257/506; 437/61–63, 437/225, 235, 974

[56]  References Cited

U.S. PATENT DOCUMENTS

| 5,091,331 | 2/1992 | Delgado et al. | |
|---|---|---|---|
| 5,162,254 | 11/1992 | Usui et al. | 437/63 |
| 5,262,346 | 11/1993 | Bindal et al. | 437/62 |
| 5,264,395 | 11/1993 | Bindal et al. | 437/61 |
| 5,356,513 | 10/1994 | Burke et al. | 156/636 |
| 5,399,233 | 3/1995 | Murazumi et al. | 156/635 |

FOREIGN PATENT DOCUMENTS 1-136328   5/1989   Japan.

OTHER PUBLICATIONS

Full English translation of Japan Kokai 1–13628 as per USPTO.
S. M. Sze, VLSI Technology, McGraw-Hill (1988) pp. 37–43.
E. Bassous, "Fabrication of Novel Three-Dimensional Microstructures by the Anisotropic Etching of (100) and (110) Silicon", *IEEE Transactions on Electron Devices*, vol. ED–25, No. 10, (Oct. 1978).

*Primary Examiner*—J. Carroll
*Attorney, Agent, or Firm*—Nixon, Hargrave, Devans & Doyle

[57]  ABSTRACT

A silicon on insulator substrate 8 provides islands of silicon 18 of uniform thickness by using a trench etch process and a silicon nitride layer 20 to provide a thickness control and polish stop for the silicon islands 18.

14 Claims, 1 Drawing Sheet

SUB-MICRON BONDED SOI BY TRENCH PLANARIZATION

BACKGROUND

Our invention relates in general to silicon on insulator (SOI) processes and devices, and, in particular, SOI substrates, devices, and methods and techniques for providing uniform SOI substrates.

In the fabrication of microelectronic circuits, silicon wafers have been the predominant material for solid-state device manufacture. However, in very large scale integrated (VLSI) devices, other materials are replacing silicon. Two important materials are silicon on insulator (silicon on silicon dioxide) and compound semiconductor material such as gallium arsenide. Such materials are chosen for their inherent high speed and for optimizing circuit parameters. For example, SOI devices are often used in communication systems because of their resistance to failure upon exposure to adverse radiation.

One SOI technique is to create islands of silicon on oxidized portions of a wafer. A wafer is patterned to create mesas that are oxidized. Polysilicon is grown over the oxidized pattern and then the wafer is ground back on its opposite side to the oxide layer. Thus, the final wafer appears to be a pattern of semiconductor-grade silicon on silicon dioxide which is supported by polysilicon. One problem with this technique is that there are many variations in the thickness of the silicon islands since it is difficult to grind the wafer to precise layer thicknesses suitable for microelectronic circuits.

Another prior art technique relies upon implanting oxygen directly into the surface of the silicon wafer in order to create a buried oxide layer (SIMOX). However, this technique results in unacceptable damage to the silicon layer which cannot be adequately cured by annealing and recrystallization. Moreover, the oxide layer tends to be too thin to provide reliable insulation.

A third technique relies upon crystal regrowth on a substrate. Here, the silicon substrate is oxidized and the oxide layer is patterned to have a portion of it removed. Polysilicon is deposited into the oxide pockets where it is recrystallized to form polysilicon. One problem with this technique is that the grain boundaries of the recrystallized polysilicon interfere with the electrical integrity of junctions in the islands.

Still another technique for providing SOI wafers relies upon wafer bonding technology. In accordance with this technology, a device wafer or a handle wafer is oxidized to have one of its surfaces coated with a layer of silicon dioxide. The two wafers are then placed together and heated in a furnace at a sufficiently high temperature in order to create an oxide bonding layer between the device wafer and the handle wafer. Thereafter, the device wafer is suitably reduced in thickness to a thin enough layer suitable for high speed microelectronic circuits. For example, an initial device wafer having a thickness of about 625 microns will be reduced to two or three microns plus or minus one to three microns.

Nevertheless, even with such SOI bonding techniques, the final thickness of the device wafer is too non-uniform for customary fabrication techniques. As a result, some devices may be as thin as one micron while others could be as thick as five microns. Given this variation in thickness of the devices, the performance of the resulting microelectronic circuits that are patterned into the substrates will vary by an amount that is unacceptable. To the extent that the dice are either too thick or too thin, the resulting devices made with such dice will likely not perform within the specifications designed for such devices.

As such, there remains an unsolved need for uniform SOI devices and a processes for making uniform SOI wafers and devices.

SUMMARY

Our invention provides a process that provides silicon on insulator wafers and silicon on insulator dice that are of uniform and consistent manufacture. To this end, our invention provides SOI wafers and dice that include relatively thick and uniform layers of buried insulating oxide along with relatively thin and uniform layers of monocrystalline silicon. Such articles are provided by a process that uses a handle wafer, typically of silicon, and a device wafer, typically of monocrystalline silicon. One of the wafers has a surface oxidized. That oxidized surface is placed against the surface of the other wafer. The wafers are heated in order to allow the oxide between the two wafers to bond the silicon device wafer to the support wafer. The device side of the wafers are then thinned using conventional techniques to a thickness slightly greater than the final desired thickness. As a next step, the device wafer is patterned to define a plurality of device areas. During this patterning, the silicon is removed from portions of the device wafer in order to expose the intermediate oxide layer. Next, a polish stop layer is uniformly deposited on the entire surface of the remaining silicon and dioxide layer. It is understood that the areas of silicon and polish stop will extend above the areas on the oxide layer on which only the polish stop layer is present. Thereafter, the device wafer surface is planarized to remove those extending areas of polish stop and silicon and to reduce the surface of the device wafer to a uniform thickness corresponding to the thickness of the polish stop layer. As a result, the final substrate will comprise areas of monocrystalline silicon separated by a polish stop layer. The polish stop layer and the silicon will be disposed on top of a uniform, relatively thick layer of oxide which itself is supported by a silicon handle wafer.

More specifically, the silicon device wafer is oxide bonded to a silicon handle wafer. After oxide bonding, the device wafer is ground down in order to provide a layer of silicon on top of the oxide layer. This grinding will typically reduce the silicon device wafer from a thickness of about 600 microns to several microns. Such grinding and polishing is accomplished by lapping and polishing machines well-known in the prior art.

The composite substrate has a handle wafer, a uniform, thick, oxide layer and a variable thickness silicon device layer. The silicon device layer is then patterned and etched by a trench etch method. In this method, the silicon device layer is masked with a resist pattern to cover some portions and expose other portions. The exposed portions of the silicon layer are removed by a suitable etchant and the remaining resist mask layer is stripped. Then the silicon-on-oxide patterned upper surface is itself uniformly deposited with a polish stop layer, typically silicon nitride. The silicon nitride surface is then chemically and mechanically polished in order to remove enough of the silicon to reduce the level of the remaining silicon to the same level as the silicon nitride. In the preferred embodiment of the invention, the silicon nitride layer that rests on top of the oxide layer acts as a polish stop for the chemical-mechanical removal operation.

DETAILED DESCRIPTION

Figure 1:
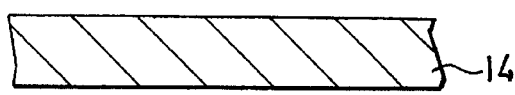
FIG. 1 is a partial sectional view of a wafer.

With reference to FIG. 1, there is shown a monocrystalline silicon device wafer 14. An initial step in the process is providing a uniform, relatively thick oxide layer 12 on one surface of device wafer 14. The oxide surface 12 is provided by thermal oxidation in a steam ambient at 1150° C. for a predetermined time of six hours in order to provide an oxide thickness of about 1.8 microns on the wafer 14. The wafer 14 is itself approximately 650 microns thick.

Figure 4:
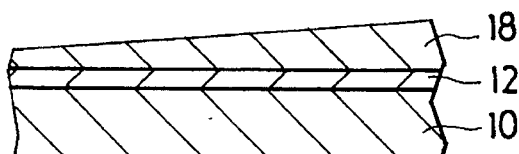
FIG. 4 is a partial sectional view of the wafer of FIG. 3 after the device wafer is reduced in size.

As a next step, the wafer 14 with its oxide layer 12 is thermally bonded to a handle wafer 10. The handle wafer 10 may be made of silicon as well but need not be device level silicon. The wafer 14 is oxide bonded to the handle wafer 10 by disposing the two wafers in a furnace and subjecting them to a temperature of about 1150° for six hours. Thereafter, a lapping and polishing machine 16 reduces the thickness of the silicon wafer 14 to a thin layer 18 as shown in FIG. 4. The layer 18 of silicon varies across the diameter of the substrate. The lapping and polishing machine 16 can only remove silicon from the water 14 to within a certain thickness and with certain degree of tolerances. So, for example, the layer 18 may be reduced to a few microns but the variation in thickness from one side of the wafer to the next may itself vary by several microns.

Figure 5:
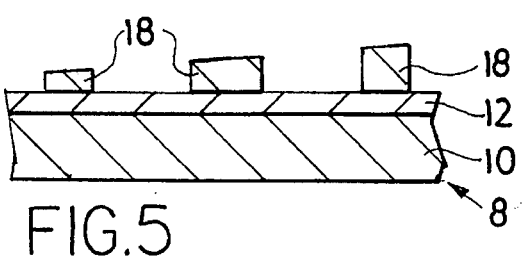
FIG. 5 is a partial sectional view of the substrate after the device layer is patterned.

As a next step, the layer 18 is patterned with a suitable resist material not shown. This resist material is selectively removed to provide a surface pattern of masked and unmasked portions. The unmasked portions are etched away by a suitable technique, such as reactive ion etching in a Chlorine gas. As a result, the substrate as shown in FIG. 5 is provided. There, the remaining areas of the silicon layer 18 appear as projections that rise above the oxide layer 12. The height of the projections 18 varies from one to the other.

Figure 6:
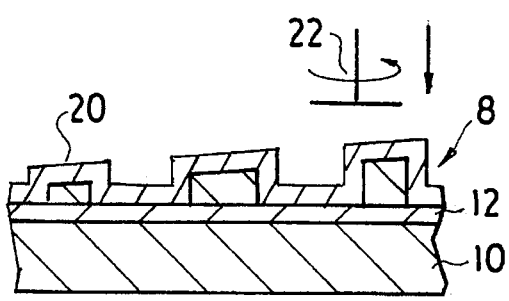
FIG. 6 is a partial sectional view of the device layer deposited with a uniform resist layer.
Figure 2:
FIG. 2 is a partial sectional view of a wafer with an oxide layer.

With reference to FIG. 6, the next step in the process includes deposition of a suitable polish stop material 20 such as silicon nitride. The silicon nitride is deposited by suitable well-known prior art techniques in order to provide layer 20 which is uniform across the surface of the substrate 8. It will be noted that the thickness of the layer 20 in the valleys between the raised silicon portions 18 is generally planar in nature and of a predetermined thickness. The silicon nitride layer 20 is then subjected to a chemical and mechanical polishing operation performed by a suitable polishing machine 22.

Figure 7:
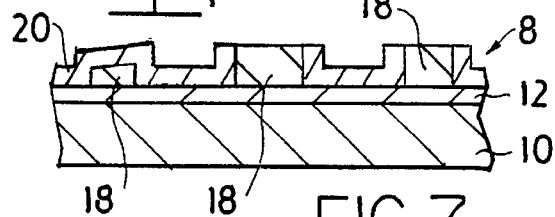
FIG. 7 is a view corresponding to FIG. 6 where the stop layer has been partially removed prior to the application of a different pressure.
Figure 3:
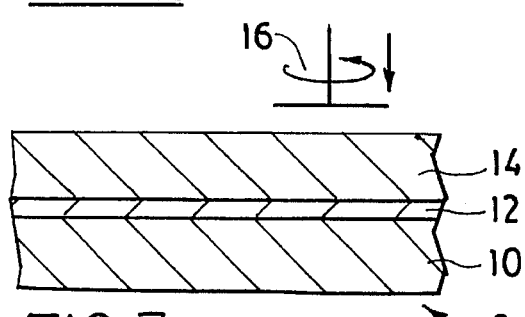
FIG. 3 is a partial sectional view of a device wafer oxide bonded to a handle wafer.
Figure 8:
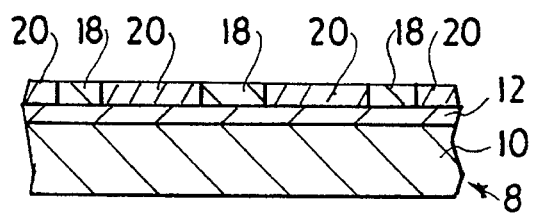

In the preferred embodiment, the silicon nitride layer 20 is deposited to a thickness of about 5000 Angstroms. It is this thickness which will become a control thickness for the final wafer. In the chem-mechanical planarization step, the substrate 20 is subjected to two sequential polishing operations. The first polishing operation is more mechanical in nature- (high pressure polish). To this end, a commercial silica based abrasive polishing slurry, diluted to 2:1 by volume, is used. The combination of very high pressure (about 23–27 p.s.i.) and an abrasive slurry provides the means in which raised areas of nitride and silicon are rapidly worn away. Moreover, the polishing pad used during the initial polishing step is rigid to help facilitate the removal of the nitride layer 20. After a predetermined time, as shown in FIG. 7, the down pressure on the machine is lessened to about 5–10 p.s.i. to produce polishing characteristics that are less mechanical and more chemical, thereby improving selectivity between the nitride stop and the exposed silicon layer. Using this process, the silicon 18 is reduced until its level is the same as the level of silicon nitride on top of the oxide layer 12 as shown in FIG. 8. During this later phase of removal, the silicon nitride layer 20 disposed between the islands of silicon 18 and on top of the oxide layer 12 acts, in effect, as a polish stop for the second polishing operation.

As a result of the above process, it is possible to obtain silicon on insulator substrates 8 with unique features. These features include a uniform oxide layer that is relatively thick, i.e., greater than one micron, and a final silicon layer that is relatively thin, i.e., of the order of 5000 Angstroms and uniform, i.e.,plus or minus 200 Angstroms. Such thin, uniform layers of silicon on insulator are highly desirable and represent a significant technical advantage of this invention. As a result, the variable silicon thicknesses of prior an techniques are overcome and more uniform products can be made. Having thus described the preferred embodiment, those skilled in the art will appreciate that changes modifications, additions, including additional steps and alterations may be made thereto without departing from the spirit and scope of the invention as set forth in the following claims. To this end, those skilled in the art will appreciate that various materials may be used for the handling wafer so long as they provide a reliable oxide bond to the device wafer 14. In addition, different polish stops, etchants, and slurries may be substituted.

What we claim is:

1. A process comprising the steps of:

providing a substrate with a handle wafer having an upper surface and a lower surface and a device wafer having an upper surface and a lower surface, said lower surface of said device water disposed opposite the upper surface of said handle wafer and an oxide layer disposed between the handle wafer and the device wafer and bonded to the opposing surfaces of each water;

forming a plurality of device regions on the upper surface of the device wafer, said device regions spaced from each other and each having a lower surface in contact with the oxide layer, an upper surface spaced from the oxide layer and raised sidewalls extending from the lower surface to the upper surface with portions of the oxide layer exposed in the spacings between the device regions and said upper surfaces being a level for at least two device regions;

covering the device regions and the exposed oxide layer with a conformal, continuous, unbroken polish stop layer of a predetermined thickness wherein the level of the polish stop layer on the exposed oxide layer corresponds to the thickness of the polish stop layer;

prior to patterning or removing any of the stop layer, planarizing the device regions by a step consisting essentially of polishing said continuous, unbroken stop layer and said device regions to the thickness of the polish stop layer on the oxide layer wherein said planarizing step consists essentially of polishing at a first pressure to remove the polish stop layer over the device areas and to remove the polish stop layer on the side walls of the device areas followed by a polishing at a second pressure, less than said first pressure, for reducing the levels of the device areas to the level of the polish stop layer between the device areas.

2. The method of claim 1 wherein the step of polishing comprises the application of slurry at a first polishing pressure followed by the application of slurry at a second polishing pressure.

3. A process comprising the steps of:

providing a substrate with a handle wafer having an upper surface and a lower surface and a device wafer having an upper surface and a lower surface, said lower surface of said device wafer disposed opposite the upper surface of said handle wafer and an oxide layer disposed between the handle wafer and the device wafer and bonded to the opposing surfaces of each wafer;

forming a plurality of device areas of different levels on the upper surface of the device wafer to define a plurality of device areas with raised side walls, the device areas spaced from each other with said oxide layer exposed in the spacings between the devices;

covering the device areas and the exposed oxide layer with a conformal continuous, unbroken polish stop layer of a predetermined thickness, wherein the level of the polish stop layer on the exposed oxide layer corresponds to the thickness of the polish stop layer;

planarizing both the continuous, unbroken polish stop layer covering device areas and the device areas covered by the polish stop layer to the predetermined thickness of the polish stop layer on the oxide layer, wherein said planarizing step includes polishing at a first pressure to remove the polish stop layer over the device areas and to remove the polish stop layer on the side walls of the device areas followed by a polishing at a second pressure, less than said first pressure, for reducing the levels of the device areas to the level of the polish stop layer between the device areas.

4. The method of claim 3 wherein the upper surface of the device wafer is patterned to expose the oxide layer.

5. The method of claim 4 wherein a layer of silicon nitride is deposited to cover the device areas and the exposed oxide surface.

6. The method of claim 3 wherein the device areas are planarized by a chemical and mechanical process to remove the conformal, continuous, unbroken polish stop layer and portions of the device areas to reduce the level of the device areas to a level equal approximately to the predetermined thickness of the polish stop layer.

7. The method of claim 3 wherein the stop layer and the covered device areas are removed only by polishing.

8. The method of claim 3 wherein the polish stop layer is deposited on the device areas.

9. A method for forming a silicon on insulator substrate comprising:

providing a handle silicon substrate;

providing a silicon substrate suitable forming microelectronic devices;

bonding the device substrate to the handle substrate by providing an oxide layer that bonds a surface of one substrate to the surface of the other substrate;

reducing the thickness of the device substrate to form a layer of device silicon of a predetermined range of thickness;

masking the device layer with a first resist layer to define field and device areas;

removing unmasked portions of the device silicon layer to form the field areas, to form device areas with different levels and with raised sidewalls, and to expose the oxide layer between the two substrates;

providing a conformal, continuous, unbroken polish stop layer of a predetermined thickness on the device and oxide layers wherein the level of the polish stop layer on the exposed oxide layer corresponds to the thickness of the polish stop layer;

removing portions of the continuous, unbroken polish stop layer and the device silicon to planarize the device silicon down to the polish stop layer on the oxide layer wherein said removing step includes polishing at a first pressure to remove the polish stop layer over the device areas and to remove the polish stop layer on the side walls of the device areas followed by a polishing at a second pressure, less than said first pressure, for reducing the levels of the device areas to the level of the polish stop layer between the device areas.

10. The method of claim 9 wherein the device substrate is reduced to a thickness that varies preferably between one and three microns.

11. The method of claim 10 wherein the continuous, unbroken polish stop layer is about 5000 Angstroms.

12. The method of claim 9 wherein the polish stop layer comprises silicon nitride.

13. The method of claim 9 wherein the silicon layer is planarized to the thickness of the polish stop layer by chemical and mechanical polishing.

14. The method of claim 9 wherein the stop layer and the device silicon are removed only by polishing.

* * * * *